(12) United States Patent
Yang et al.

(10) Patent No.: US 6,180,969 B1
(45) Date of Patent: Jan. 30, 2001

(54) CMOS IMAGE SENSOR WITH EQUIVALENT POTENTIAL DIODE

(75) Inventors: Woodward Yang; Ju Il Lee; Nan Yi Lee, all of Ichon-shi (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/258,307

(22) Filed: Feb. 26, 1999

(30) Foreign Application Priority Data

Feb. 28, 1998 (KR) .................................................. 98-6687

(51) Int. Cl.$^7$ ........................ H01L 31/062; H01L 31/113
(52) U.S. Cl. ........................ 257/291; 257/292; 438/73; 438/90
(58) Field of Search .......................... 257/292, 291; 438/90, 73

(56) References Cited

U.S. PATENT DOCUMENTS

| | | | |
|---|---|---|---|
| 4,484,210 | 11/1984 | Shiraki et al. | 357/24 |
| 4,527,182 | 7/1985 | Ishihara et al. | 357/24 |
| 4,984,047 | 1/1991 | Stevens | 357/30 |
| 5,051,797 | 9/1991 | Erhardt | 357/24 |
| 5,181,093 | 1/1993 | Kawaura | 257/223 |
| 5,202,907 | 4/1993 | Yonemoto | 377/60 |
| 5,262,871 | 11/1993 | Wilder et al. | 358/213.11 |
| 5,306,931 | 4/1994 | Stevens | 257/223 |
| 5,471,515 | 11/1995 | Fossum et al. | 377/60 |
| 5,567,632 | 10/1996 | Nakashiba et al. | 437/35 |
| 5,587,596 | * 12/1996 | Chi et al. | 257/223 |
| 5,625,210 | * 4/1997 | Lee et al. | 257/292 |
| 5,760,458 | 6/1998 | Bergemont et al. | 257/588 |
| 5,828,091 | 10/1998 | Kawai | 257/218 |
| 5,835,141 | 11/1998 | Ackland et al. | 348/308 |
| 5,841,159 | 11/1998 | Lee et al. | 257/291 |
| 6,040,593 | * 3/2000 | Park | 257/292 |
| 6,043,479 | * 3/2000 | Chiang | 250/208.1 |
| 6,072,206 | * 6/2000 | Yamashita et al. | 257/292 |

FOREIGN PATENT DOCUMENTS

| | | |
|---|---|---|
| 0738010A2 | 10/1996 | (EP) . |
| 0738010A3 | 10/1998 | (EP) . |
| 2751824 | 1/1998 | (FR) . |
| 2324651 | 10/1998 | (GB) . |

OTHER PUBLICATIONS

B.C. Burkey et al., "The Pinned Photodiode for an Interline–Transfer CCD Image Sensor", International Electron Devices Meeting, San Francisco, CA, Dec. 9–12, 1984.

Patent Abstract of Japan, Publication No. 08097393, published Apr. 12, 1996.

Hon–Sum Wong et al, "CMOS Active Pixel Image Sensors Fabricated Using a 1.8V, 0.25 μm CMOS Technology", 1996 IEEE, pp. 915–918.

* cited by examiner

*Primary Examiner*—William Mintel
(74) *Attorney, Agent, or Firm*—Jacobson, Price, Holman & Stern, PLLC

(57) ABSTRACT

A CMOS image sensor according to the present invention has a low-voltage photodiode which is fully depleted at a bias of 1.2–4.5V. The photodiode comprises: a P-epi layer; a field oxide layer dividing the P-epi layer into a field region and an active region; a $N^-$ region formed within the P-epi layer, wherein the first impurity region is apart from the isolation layer; and a $P^0$ region of the conductive type formed beneath a surface of the P-epi layer and on the $N^-$ region, wherein a width of the $P^0$ region is wider than that of the $N^-$ region so that a portion of the $P^0$ region is formed on the P-epi layer, whereby the $P^0$ region has the same potential as the P-epi layer.

20 Claims, 10 Drawing Sheets

CMOS IMAGE SENSOR WITH EQUIVALENT POTENTIAL DIODE

BACKGROUND OF THE INVENTION

1. Field of the Invention

The present invention relates to a solid state image sensing device capable of producing a high quality picture, and more particularly to an image sensor associated with the CMOS technology and an equivalent potential diode.

2. Description of the Related Art

With the development of telecommunication and computer systems, CMOS image sensors can be utilized in electronic imaging systems. The demand for CMOS image sensors will increase in proportion to the rate of development of digital still cameras, PC cameras, digital camcoders and PCS (personal Communication Systems), as well as standard analog and advanced digital TV and video systems. Further, the CMOS image sensor can be used in video game machines, security cameras and micro cameras for medical treatment.

FIG. 1 is a block diagram illustrating a conventional CCD (Charge Coupled Device) image sensor. As shown in FIG. 1, the CCD image sensor 100 includes a photoelectric conversion and charge accumulator 10 for absorbing light from an object and collecting the photogenerated charges into signal charge packets. Also, the CCD image sensor 100 includes a charge transfer region 20 to convey charge packets from the photoelectric conversion and charge accumulator 10 and a charge-to-voltage signal converter 30 to generate a voltage output of the signal charge packets as transferred through the charge transfer region 20.

A photodiode is widely used as a photoelectric conversion and charge accumulator. The photodiode having a PN junction forms a potential well to accumulate the charges generated by light from the object. The charges generated in the photoelectric conversion and charge accumulator 10 are trapped in the potential well of the photodiode and the trapped charges are transferred to a desired position according to the movement of the potential well. Such a charge movement is controlled by the charge transfer region 20.

The charge-to-voltage signal converter 30 generates a voltage that is related to the transferred signal charge packets. Since electric charges generate an electric field which corresponds to an electrostatic potential, the change in electric charge concentration as a result of introducing a signal charge packet can be measured by the change in the electrostatic potential (i.e. the depth of the potential well). This potential well depth variation contributes to voltage detection in the CCD image sensor.

After detecting the signal, the charges in the current potential well must be removed for subsequent signal detections. This removal of the charges is achieved by flushing the signal charge packet into a drain. By lowering the potential barrier between the potential well and the drain, the potential well can be "reset".

As stated above, the conventional CCD image sensor detects the image signals through the charge coupling. The photodiode, which acts as a photosensitive plate corresponding to an image pixel, does not immediately extract photoelectric current, but extracts it after the charges are accumulated for a predetermined time into a signal packet. Accordingly, the CCD image sensor has a good sensitivity with low noise. However, since the CCD image sensor must continuously transfer photoelectric charge packets, the required driving signals are very complicated, require large voltage swings of approximately 8V to 10V, have high power consumption, and require both positive and negative power supply. Compared with submicron CMOS technology which needs about 20 photomasks, CCD technology is more complicated and also more expensive due to additional photomask processes (about 30 to 40 photomasks). In addition, since the CCD image sensor chip can not be integrated with signal processing circuitry which is typically implemented by CMOS circuitry, it is very difficult to miniaturize the size of the image sensor and implement in a wider variety of applications.

Accordingly, a wider and deeper study of the APS (active pixel sensor), which is controlled by the switching operation of a transistor, has been made with the combination of the CMOS and CCD technologies.

FIG. 2 is a circuit diagram illustrating a unit pixel of the conventional APS proposed by U.S. Pat. No. 5,471,515 of Fossum, et al. The APS uses a photogate 21 of the MOS capacitor structure to collect photoelectric charges. In order to transfer the charges generated under the photogate 21 to a floating diffusion region 22, the APS includes a transfer transistor 23. Also, the APS includes a reset transistor 24, a drain diffusion region 25, a drive transistor 26 acting as a source follower, a select transistor 27 to select a pixel array row, and a load transistor 28.

However, in the APS as shown in FIG. 2, the MOS capacitor, which acts as a photosensitive plate, is made of a thick polysilicon layer so that a large fraction of blue light (with a shorter wavelength than red light) is preferentially absorbed by the polysilicon. As a result, it is difficult to obtain high quality color images at low illumination.

FIG. 3 is a cross-sectional view of the APS proposed by U.S. Pat. No. 5,625,210 of Lee, et al. U.S. Pat. No. 5,625,210 disclosed the APS with a well-known pinned photodiode. The APS in FIG. 3 includes a pinned photodiode (PPD) to collect the photoelectric charges and a transfer transistor $T_x$ having an $N^-$ region 36 for transferring the photoelectric charges from the PPD to a floating $N^+$ region 37 of an output node. There is provided a reset transistor having the $N^+$ region 37 for one active region and also having an $N^+$ region 38 for another active region coupled to a power supply VDD. The impurities are introduced into a lightly doped P-epi (epitaxial) layer 32 which is grown on a more heavily doped P-type substrate 31. The PPD is formed by a buried $N^+$ region 33 and a $P^+$ pinning region 34. Additionally, in FIG. 3, each of the reference numerals 35a, 35b and 35c denote a transistor gate.

Specifically, as shown in FIG. 4 and in U.S. Pat. No. 5,625,210 of Lee, et al, the PPD is formed by sequential ion implantation of $N^+$ and $P^+$ impurities, using a single mask layer 41 (e.g., photoresist pattern). In particular, the PPD is formed by only one mask for both $N^+$ and $P^+$ ion implantation processes.

However, if the $N^+$ and $P^+$ ion implantation are sequentially performed using only one mask, the $P^+$ pinning region 34 formed above the $N^+$ region 33 will not be reliably electrically connected to the P-epi layer 32. Especially, since a higher energy is used to implant the $N^+$ region 33 compared with the $P^+$ pinning region 34, such ion implantation processes will result in the $P^+$ pinning region 34 being electrically isolated from the P-epi 32. As a result, the $P^+$ pinning region 34 and the P-epi layer 32 will be at different potentials especially when using a low power supply of 3.3V. This difference in potential prevents the full depletion of the $N^+$ region 33 and, therefore, a stable pinning voltage can not be obtained. Furthermore, dopant segregation of boron atoms into the field oxide layer 39 may also contribute toward isolating the P+ pinning region 34 from the P-epi layer 32.

Another U.S. Pat. No. 5,567,632 of Nakashiba and Uchiya disclosed the buried (or pinned) photodiode fabricating method, which employs inclined ion implantation and a single mask layer. In this case, it is difficult to control and monitor the ion implantation angle in a mass production environment. That is, it is very difficult to measure the precise alignment of the N+ pinning region 34 and the P+ region 33 and to make the buried photodiodes uniform and reliable. In addition, the use of an angled ion implantation of either N+ or P+ limits the placement of the transfer gate to a specific orientation relative to the chip and wafer due to the angled ion implantation.

SUMMARY OF THE INVENTION

It is, therefore, an object of the present invention to provide an image sensor which can operate at low voltage.

Another object of the present invention is to provide a method for fabricating an image sensor using a submicron CMOS technology.

A further object of the present invention is to provide an image sensor with improved charge transfer efficiency using an equivalent potential diode.

In accordance with an aspect of the present invention, there is provided a CMOS image sensing device comprising: a semiconductor layer of a first conductive type; a well region of the first conductive type, being locally positioned at the semiconductor layer; a photodiode formed in the semiconductor layer for sensing light from an object; at least one depletion transistor formed in the semiconductor layer for transferring photoelectric charges generated in the photodiode to a floating junction which is formed on a portion of the semiconductor layer and which stores the photoelectric charges; and at least one enhancement transistor formed in the well region for outputting electrical signals in response to an amount of the photoelectric charges transferred from the floating junction.

In accordance with another aspect of the present invention, there is provided a CMOS image sensing device comprising: a semiconductor layer of a first conductive type; a well region of the first conductive type, being locally positioned at the semiconductor layer; at least one photodiode formed in the semiconductor layer and outside of the well region for sensing light from an object; a floating junction for storing photoelectric charges generated in the photodiode; a first depletion transistor formed outside of the well region and between the photodiode and the floating junction for transferring the photoelectric charges to the floating junction, and wherein the first depletion transistor is controlled in response to a first control signal; a second depletion transistor formed outside of the well region and coupled to the floating junction for resetting the floating junction to a predetermined potential; a first enhancement transistor formed in the well region and for outputting electrical signals in response to an amount of the photoelectric charges stored in the floating junction, wherein a common active region of the second depletion transistor and the first enhancement transistor is positioned at a boundary between the semiconductor layer and the well region; and a second enhancement transistor formed in the well region and receiving address signals for selecting a pixel.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, the present invention will be described in detail referring to the accompanying drawings.

Figure 5:
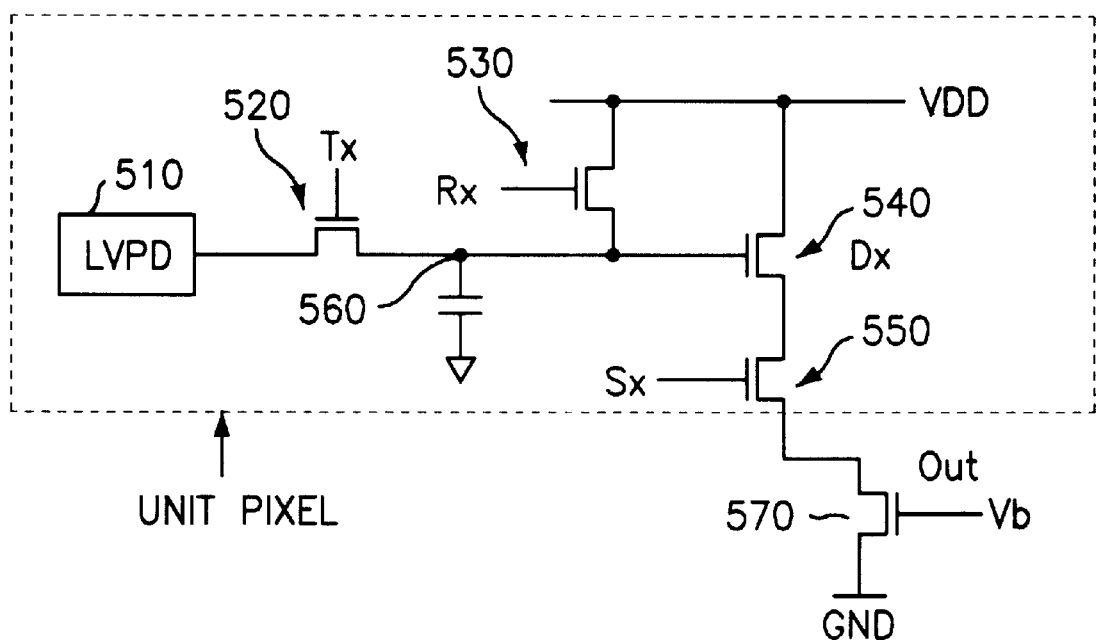
FIG. 5 is a circuit diagram illustrating a unit pixel of a CMOS image sensor according to the present invention.

Referring to FIG. 5, there is shown a unit pixel of a CMOS image sensor according to the present invention. The unit pixel includes a low-voltage photodiode (LVPD) 510 and four NMOS transistors. A transfer transistor ($T_x$) 520 transfers photoelectric charge collected by the low-voltage photodiode 510 for sensing on a floating node 560. A reset transistor ($R_x$) 530 resets the floating node 560 by flushing charges and setting the potential of the node to a known value. A drive transistor ($D_x$) 540 acts as a source follower buffer amplifier, and a select transistor 550 provides addressing capability to a common load transistor ($S_x$) 570.

The present invention has the important advantage in that the image sensor including the low-voltage photodiode 510 and NMOS transistors can be fabricated using common CMOS technology. Also, the transfer transistor ($T_x$) 520 and the reset transistor ($R_x$) 530 are formed as depletion mode or low threshold voltage NMOS transistors in order to improve the charge transfer efficiency and reduce any voltage drop and/or loss of signal charge in the output signal. In particular, a suitable NMOS transistor can be fabricated by using the P-epi layer without the P-well. This negative NMOS transistor may have a slightly negative threshold voltage.

Figure 6:
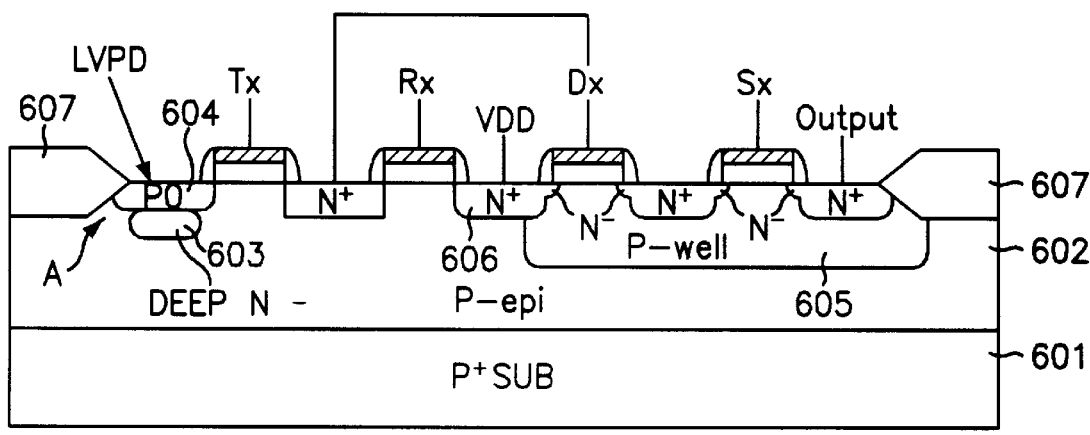
FIG. 6 is a cross-sectional view illustrating a unit pixel of a CMOS image sensor according to the present invention.

FIG. 6 is a cross-sectional view illustrating the unit pixel of the CMOS image sensor according to the present invention. As shown in FIG. 6, to improve the sensitivity of the CMOS image sensor and to improve the modulation transfer function by reducing the "miscollection" of photogenerated charges, an epitaxial layer is used to build CMOS devices in the present invention. Namely, a wafer having a P-epi layer 602, which is formed on a P+ substrate 601 to an impurity concentration of approximately $10^{14}$ ions/cm$^3$, is used. The P-epi layer 602 is used for the following reasons:

1) the P-epi layer 602 allows the depletion region of the low-voltage photodiode to be large and deep which improves the sensitivity by increasing the ability of the low-voltage photodiode in collecting photogenerated charges. In the present invention, the thickness of the P-epi layer 602 is in a range of approximately 2 to 5 µm.

2) the highly doped P substrate 601 beneath the P-epi layer 602 improves the sensor array modulation transfer function by reducing the random diffusion of the photoelectric charges. The random diffusion of charges in the P-type substrate leads to the possible "miscollection" of the photogenerated charges by neighboring pixels and directly results in a loss of image sharpness or a lower modulation transfer function. The shorter minority carrier lifetime and higher doping concentration of the P+ substrate 601 significantly reduces the "miscollection" of photoelectric charges since the charges are quickly recombined before diffusing to the neighboring pixels. In the present invention, preferably, the P+ substrate 601 and the P-epi layer 602 have resistivity of about 0.01 Ωcm and 10–25 Ωcm, respectively. Accordingly, the impurity concentration of the P+ substrate 601 should be much higher than that of the P-epi layer 602 and the corresponding minority carrier lifetime of the P+ substrate 601 should be much lower than that of the P-epi layer 602.

Referring again to FIG. 6, the low-voltage photodiode according to the present invention includes a lightly doped N⁻ region 603 formed in the P-epi layer 602 and a lightly doped P⁰ region 604 formed about the lightly doped N⁻ region 603. This low-voltage photodiode has excellent sensitivity and photon-to-electron quantum efficiency since the light sensing region is not covered with a polysilicon layer. In particular, the sensitivity of short wavelength, blue light, is significantly improved. As a result of the lightly doped P-epi layer, the charge depletion region of the low-voltage photodiode also has high sensitivity for long wavelength, red or infrared light. In addition, this low-voltage photodiode has the ability to rapidly and efficiently transfer charge to the floating sensing node from the light sensing region. Furthermore, dark current is decreased by controlling the potential of interface generation states at the silicon-silicon dioxide interface.

To implement the above-mentioned advantages, the low-voltage photodiode should be fully depleted at a low voltage which is compatible with a power supply of 5V, 3.3V or 2.5V. However, the conventional CCDs require high driving voltage in excess of 8V in order to effectively transfer charges and fully deplete the buried photodiode fabricated in a typical CCD process. Due to high temperature processes after ion implantation of the buried photodiode in a CCD process, the resulting buried photodiode can not be fully depleted at a voltage of less than 5V. Also, buried photodiodes using inclined ion implantation techniques can not be stably implemented by a typical submicron CMOS process which utilizes the low-temperature processes.

For example, 0.5 μm CMOS process for 3.3V operation should have a buried photodiode structure which is fully depleted in the range of 1.2V–2.8V. If this voltage is too high, incomplete charge transfer of the photoelectric charges to the floating sensing node will cause many undesirable imaging artifacts. On the other hand, if this voltage is too low, the charge capacity of the buried photodiode will be very low resulting in a small output signal.

Without additional thermal treatment which has been used in the conventional CCD processes, by using only two masks, two ion implantation processes and the thermal treatment of the conventional submicron CMOS process, the present invention fabricates a low-voltage photodiode which can be fully depleted at a voltage range of 1.2V–4.5V in the case of the power supply of 3.3V and 5V. This will be concretely illustrated in the processing steps according to the present invention. As shown in FIG. 6, because the edge of a field oxide layer 607 and the edge of the N⁻ region 603 are sufficiently spaced apart (see "A" in FIG. 6), the P⁰ region 604 is electrically connected to the P-epi layer 602 and is insured to be at the same potential. That is, a sidewall and a bottom portion of the P⁰ region 604 is in contact with the P-epi layer 602, thereby achieving the same potential in the two layers 603 and 602. So, by appropriate selection of the N⁻ and P⁰ implant energy, the N⁻ layer 603 can be reliably fully depleted at a voltage between 1.2V–4.5V.

Of four NMOS transistors, the transfer transistor ($T_x$) and the reset transistor ($R_x$) are low threshold voltage or depletion mode transistors to insure a full reset of the floating node and maximize the output voltage dynamic range. The drive transistor ($D_x$) and the select transistor ($S_x$) are typical NMOS transistors. Accordingly, the drive transistor ($D_x$) and the select transistor ($S_x$) are formed in the P-well. However, a lateral well diffusion within the pixel causes the electrical characteristics of the low-voltage photodiode and the native transistors to deteriorate. Accordingly, the P-well 605 is limited to a small area but, through a lateral diffusion, incorporates all the drive and select transistors without impacting the low-voltage photodiode and associated reset and transfer transistors. In the preferred embodiment of the present invention, the P-well region includes a portion of the drain 606 of the reset transistor ($R_x$) and extends to the field oxide layer 607 (hereinafter, this P-well 605 is referred to as a mini P-well). Further, the drive transistor ($D_x$) and the select transistor ($S_x$) formed in the P-well 605 use the LDD (Lightly Doped Drain) structure. The transfer transistor ($T_x$) and the reset transistor ($R_x$) formed in the P-epi layer 602 do not use the LDD (Lightly Doped Drain) structure, which improves the isolation of the floating node from the reset voltage, reduces the amount of coupling between the reset and transfer clock signal by reducing the overlap capacitance, and increases the overall sensitivity of the pixel by reducing the total capacitance associated with the floating node.

The image sensing mechanism according to the present invention will be described in detail:

a) The transfer transistor ($T_x$), the reset transistor ($R_x$) and the select transistor ($S_x$) are turned off. At this time, the low-voltage photodiode is fully depleted.

b) Photons are absorbed in the silicon substrate and generate photoelectric charges.

c) The photoelectric charges are collected by the low-voltage photodiode.

d) After a predetermined integration time to collect photoelectric charges, the floating sensing node is reset by turning on the reset transistor ($R_x$).

e) The unit pixel is selected for read out by turning on the select transistor ($S_x$).

f) The output voltage V1 of the source follower buffer is measured (this voltage indicates only the DC level shift of the floating sensing node).

g) The transfer transistor ($T_x$) is turned on.

h) All the collected photoelectric charges are transferred to the floating sensing node.

i) The transfer transistor ($T_x$) is turned off.

j) The output voltage V2 of the source follower buffer is measured. The resulting difference output signal, V1–V2, is due to the transfer of photoelectric charges. This method is called the CDS (Correlated Double Sampling) method and provides for cancellation of offset voltage, reset switch noise and 1/f flicker noise.

k) Repeat steps (a) to (j). The low-voltage photodiode is fully depleted at step (h).

FIGS. 7A to 7J are cross-sectional views illustrating a method for fabricating the unit pixel of the CMOS image sensor according to the present invention.

Figure 7A:
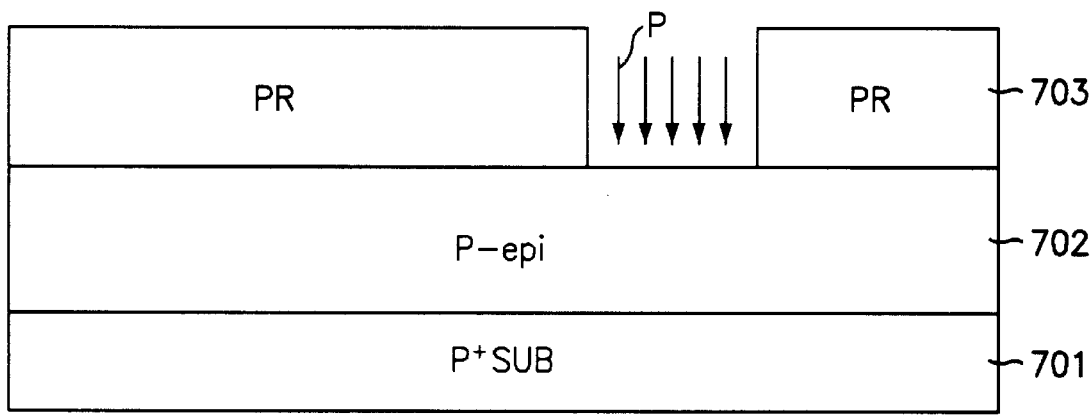
FIGS. 7A to 7J are cross-sectional views illustrating a method for fabricating the unit pixel of FIG. 6.

Referring to FIG. 7A, a P-epi layer 702 is formed on a P+ substrate 701 and impurities are introduced into the exposed P-epi layer. At this time, since there are, within the unit pixel, one low-voltage photodiode and two native NMOS transistor (transfer and reset transistors) as well as submicron NMOS transistors (drive and select transistors), a conventional P-well substrate as found in a typical submicron CMOS process is not used for the CMOS image sensor of the present invention. The conventional well structure as found in a typical submicron CMOS process will degrade the electrical characteristics of the low-voltage photodiode and the native NMOS transistors due to the limited tolerance for lateral dopant diffusion within the small pixel. That is, as illustrated above, the mini P-well process is carried out.

Figure 7B:
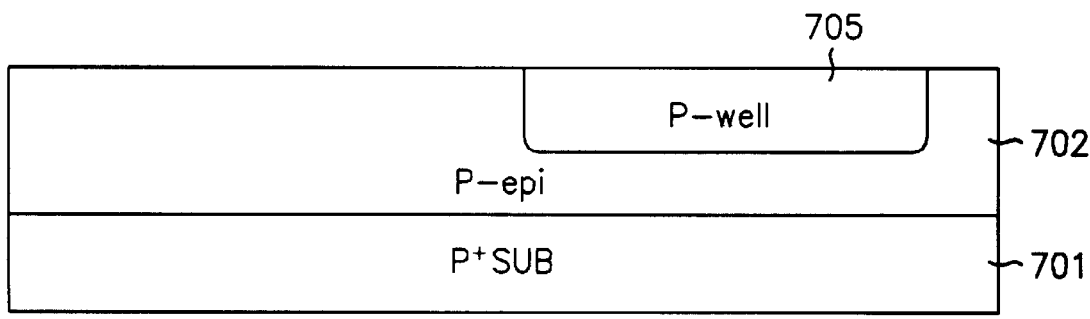

Referring to FIG. 7B, after removing the P-well ion implantation mask 703, a P-well 705 which incorporates both the drive and select transistors is formed by the lateral diffusion during thermal treatment.

Figure 7C:
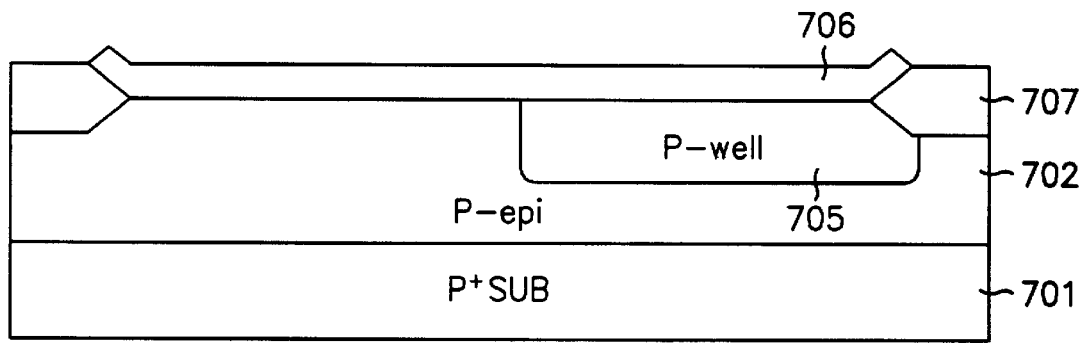

Referring to FIG. 7C, for the purpose of device isolation, a field oxide layer 707 to define a field region and an active region is formed by the LOCOS process, the trench isolation process or similar process. In this embodiment, a multilayer mask pattern 706 where a pad oxide layer, buffer polysilicon layer and a nitride layer are formed in this order is used as a wet oxidation mask for forming the field oxide layer. The isolation is well-known to those of ordinary skill in the art to which the subject matter pertains.

Figure 7D:
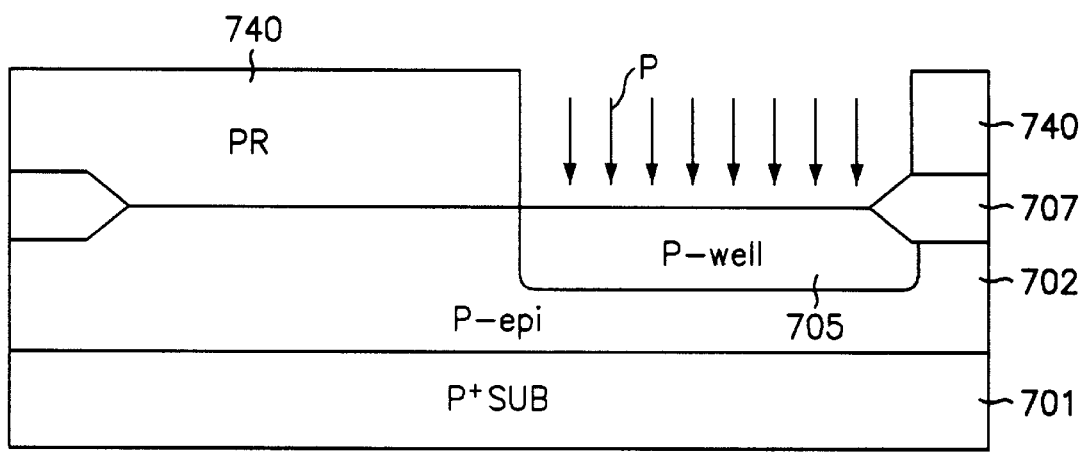

Referring to FIG. 7D, after removing the multilayer mask pattern 706, a mask pattern 740 to expose the P-well 705 is formed and an ion implantation is carried out to adjust the N-channel threshold voltage and the punchthrough. By using such an ion implantation, the drive and select transistors within the unit pixel can exhibit the typical characteristics of the submicron NMOS transistors. Meanwhile, the use of ion implantation to adjust the threshold voltage is not carried out in a region in which the low-voltage photodiode and two native transistors are to be formed.

Figure 7E:
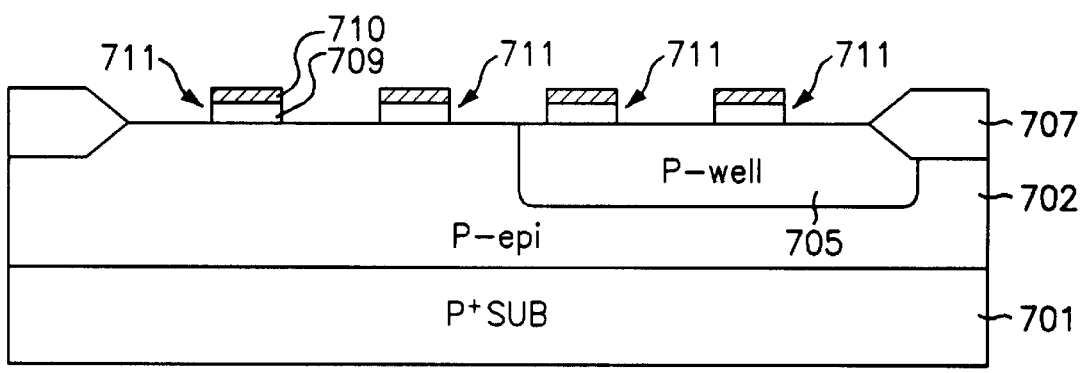

Referring to FIG. 7E, to form four NMOS transistors within the unit pixel, a polysilicon layer 709 and a tungsten silicide layer 710 are, in this order, formed on the P-epi layer 702 and patterned by mask and etching processes, thereby forming four gate electrodes 711 which are spaced a predetermined distance apart.

Figure 7F:
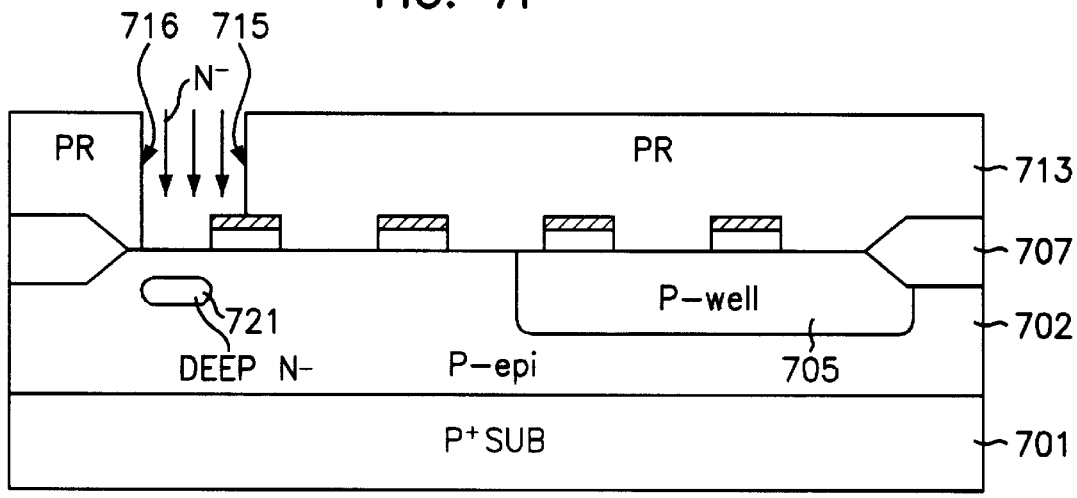
Figure 8A:
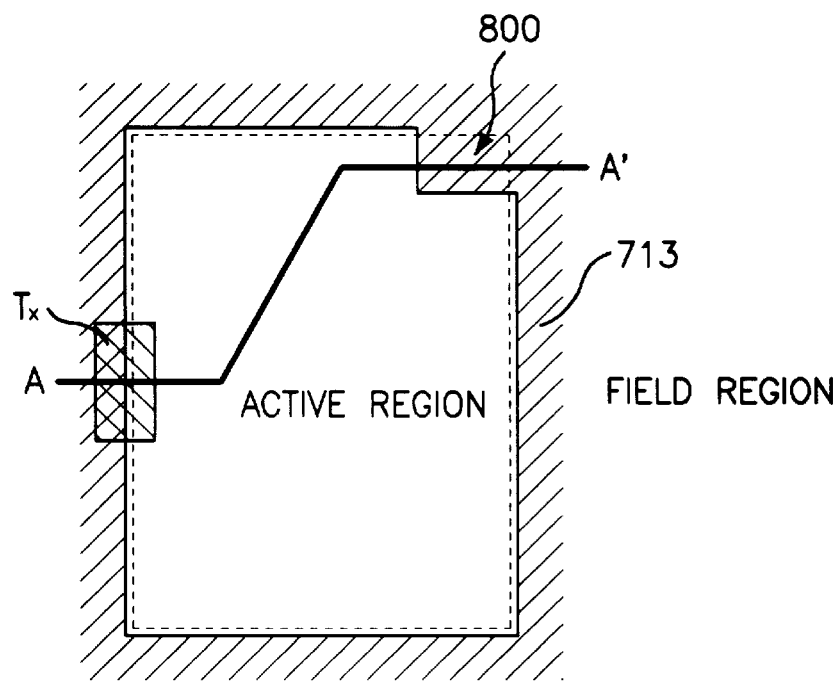
FIGS. 8A and 8B are top views of mask patterns used to implant impurity ions into an active region.

Next, referring to FIG. 7F, a mask pattern 713 is formed on the resulting structure to form a lightly doped N⁻ region 721 of the low-voltage photodiode and impurities are introduced into the P-epi layer 702 at a concentration of approximately $10^{17}$ ions/cm³. At this time, it should be noted that it is very important to define an ion implantation area using the mask pattern 713 as an implantation mask. As shown in the cross-sectional view of FIG. 7F, one end 715 of the mask pattern 713 is positioned in the middle of the gate electrode of the transfer transistor and the other end 716 thereof is positioned inside the active region. In other words, the interface between the field region and the active region is covered with the mask pattern 713 so that a portion of the active region, which is in the neighborhood of the interface, is not applied to the ion implantation. The mask pattern 713 is taken along line A–A' of a photomask in FIG. 8A. As shown in FIG. 8A, the mask pattern 713 is aligned along an interface (dotted lines in FIG. 8A) between the active region and the field region but it covers a portion 800 of the active region, thereby preventing N⁻ impurity ions from being introduced into the edge thereof.

Figure 1:
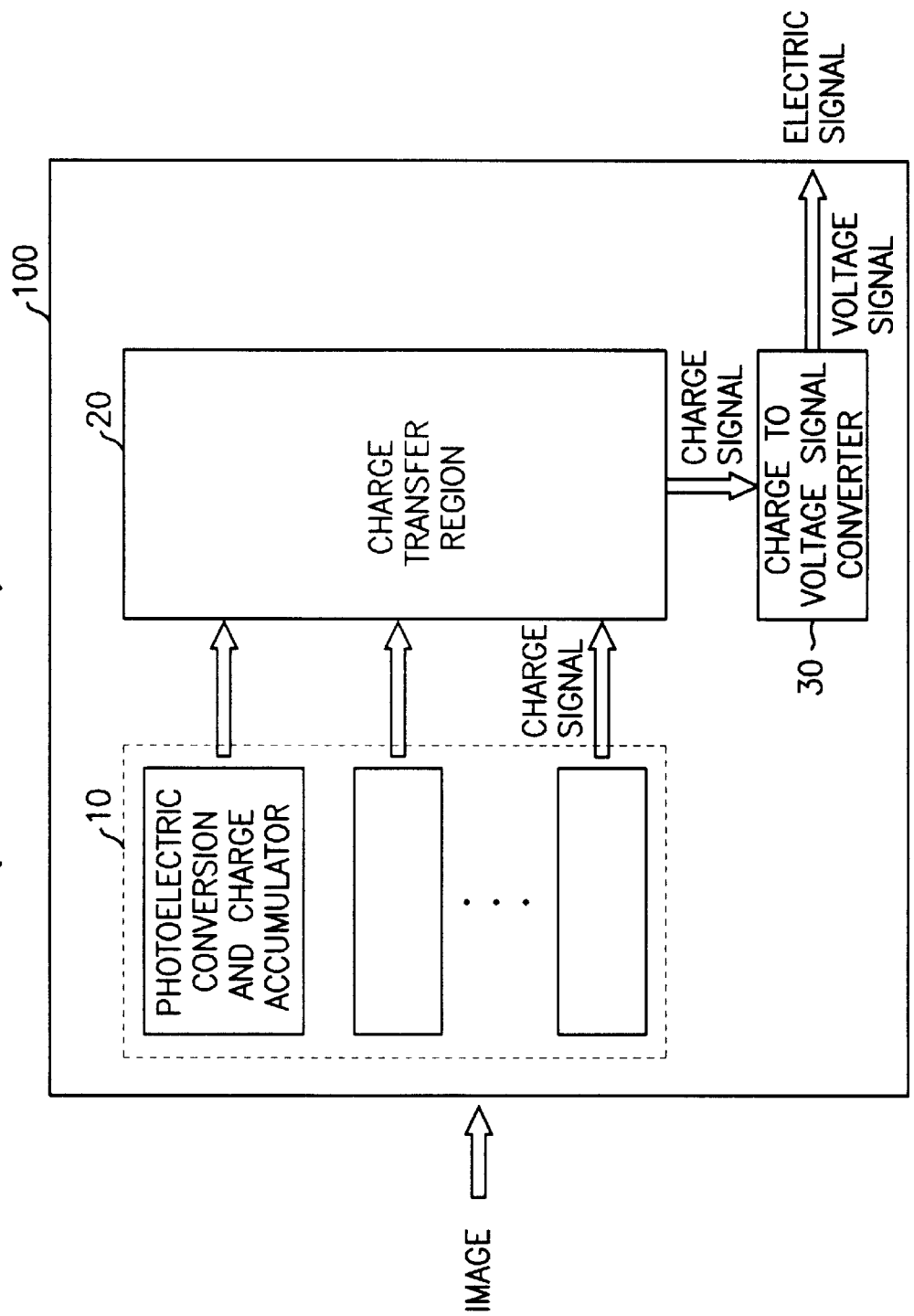
FIG. 1 is a block diagram illustrating a conventional CCD image sensor.
Figure 2:
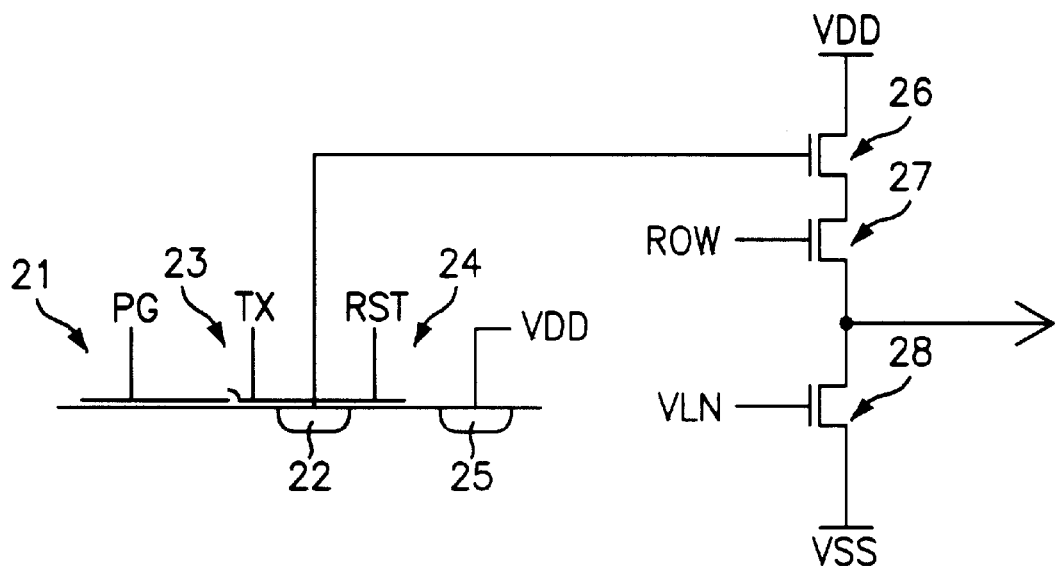
FIG. 2 is a circuit diagram illustrating a unit pixel of the conventional APS.
Figure 3:
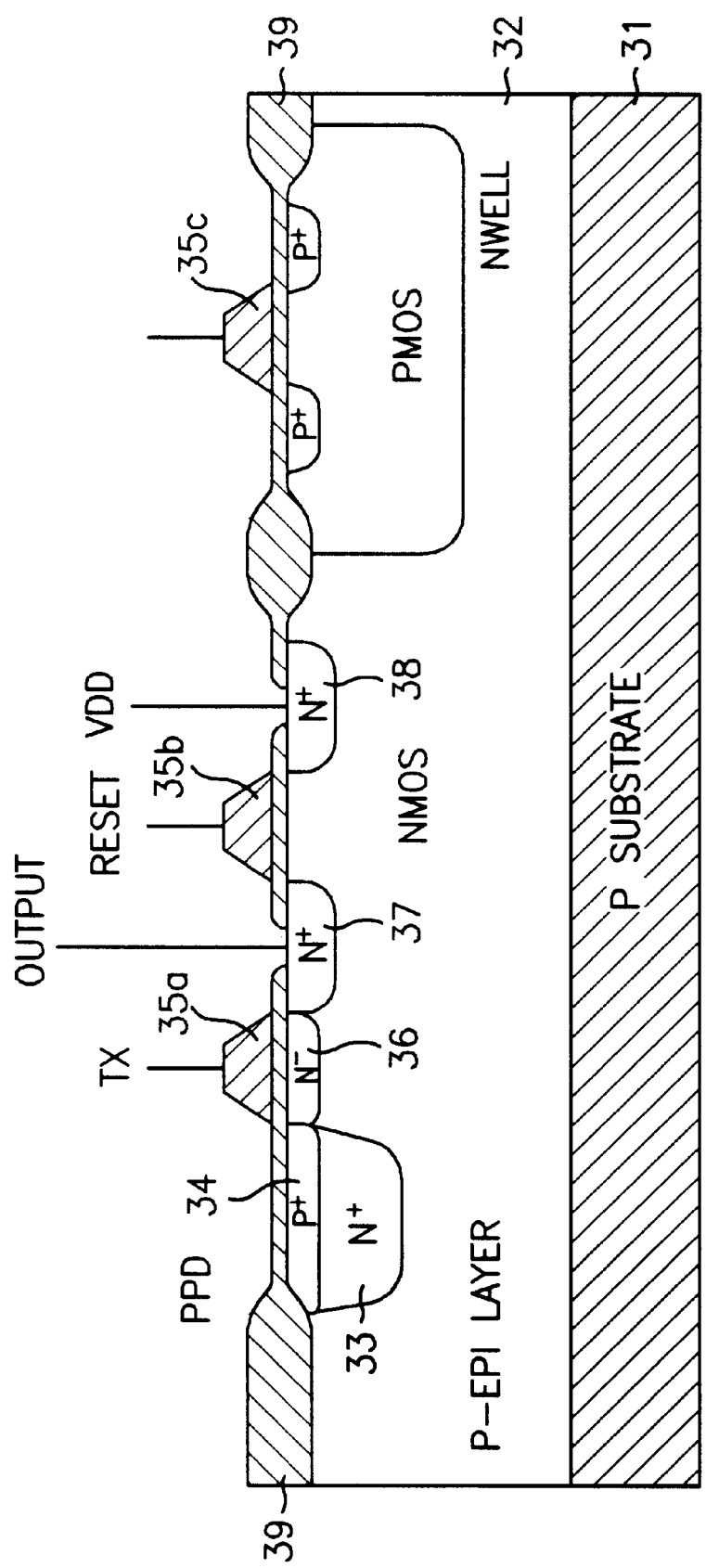
FIGS. 3 and 4 are cross-sectional views illustrating the conventional APS of FIG. 2.
Figure 4:
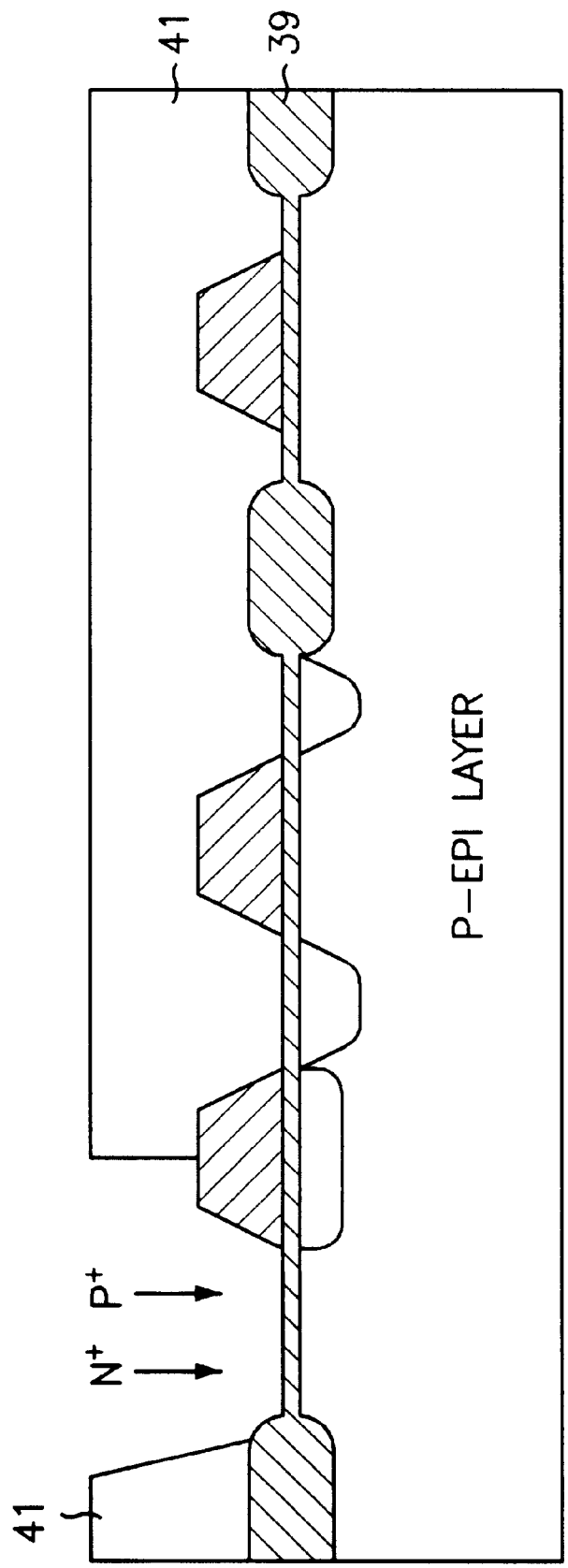
Figure 7G:
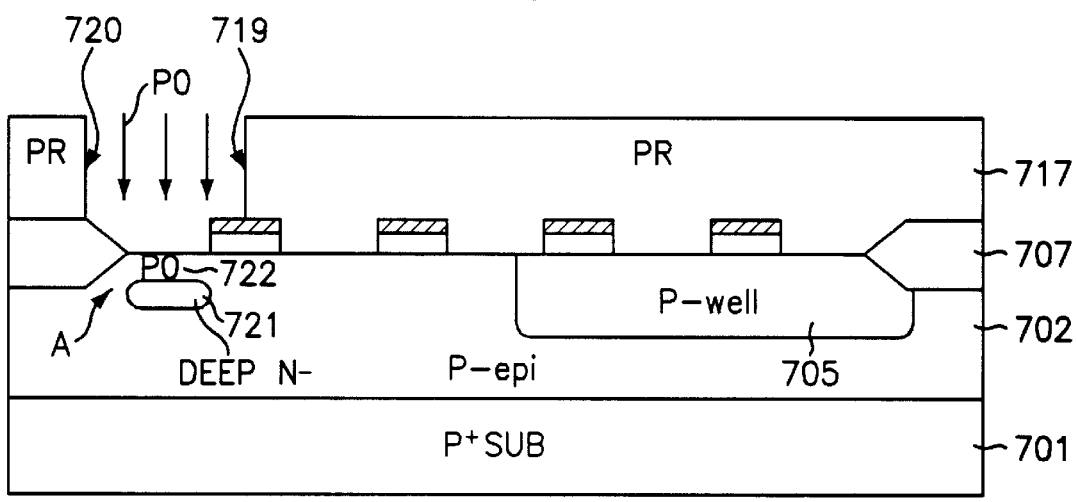
Figure 8B:
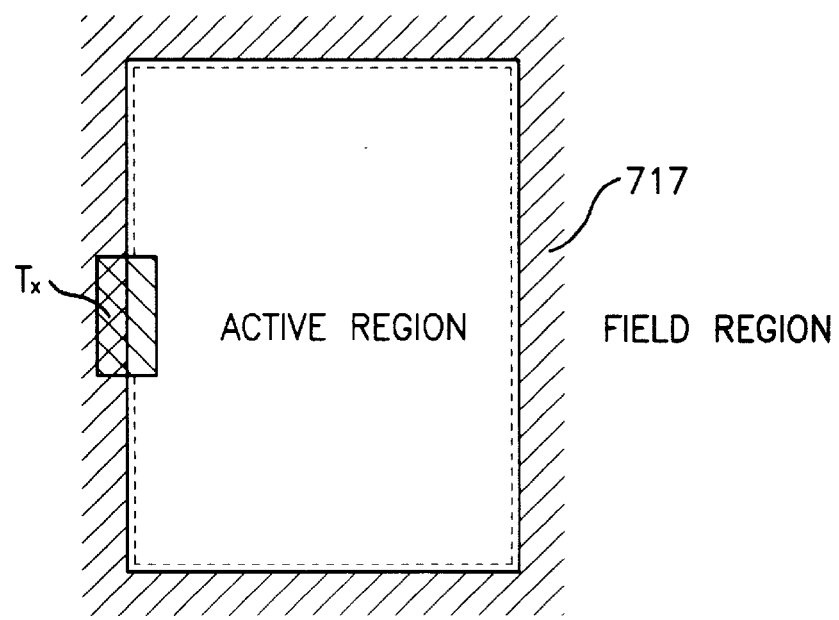

Referring to FIG. 7G, the mask pattern 713 is removed and another mask pattern 717 is formed to form a lightly doped P⁰ region 722. The impurities are introduced into the P-epi layer 702 at a concentration of approximately $10^{18}$ ions/cm³. At this time, the acceleration energy of the P⁰ ions is lower than that of N⁻ ions of FIG. 7F so that the lightly doped P⁰ region 722 is positioned on the lightly doped N⁻ region 721. As shown in the cross-sectional view of FIG. 7G, one end 719 of the mask pattern 717 is positioned in the middle of the gate electrode of the transfer transistor and the other end 720 thereof is positioned on the field oxide layer 707. FIG. 8B shows a top view of the mask pattern 717. Accordingly, the entire active region of the low-voltage photodiode of the present invention is exposed so that a sufficient electrical connection A is achieved between the P⁰ region 722 and the P-epi layer 702, compared with the electrical connection shown in FIG. 3. Although the present invention employs two masks of different sizes, it should be noted that such a connection A can be achieved by controlling the depth of the impurity regions.

On the other hand, with respect to the ion implanting processes of FIGS. 7F and 7G, the thickness of the gate electrode of the transfer transistor must be controlled. Since the doping profile of the low-voltage photodiode determines the charge transfer efficiency, the doping area is self-aligned with the one end of the gate electrode of the transfer transistor. Accordingly, the gate electrode of the transfer transistor must have such a thickness as to block the accelerated ions. If not, the ions penetrate into the gate electrode so that the ion doped layers 721 and 722 are not self-aligned with the edge of the gate electrode of the transfer transistor. This misalignment degrades the charge transfer efficiency. The polysilicon layer and the tungsten silicide layer are formed at a thickness of about 1500 Å and below 1500 Å, respectively, in the conventional CMOS process, but in the preferred embodiment of the present invention they are formed at a thickness of above 2000 Å and above 1500 Å, respectively. As a result, the thickness of the gate electrode of the transfer transistor according to the present invention is relatively thicker than that of the NMOS transistor fabricated by the conventional CMOS processes.

In addition, since the edge of the lightly doped N⁻ region 721 is apart from the edge of the field oxide layer 707 and the sufficient electrical connection A is achieved between the P⁰ region 722 and the P-epi layer 702, the P⁰ region 722 and the P-epi layer 702 have the same potential even at a supply voltage below 5V. Accordingly, the lightly doped N⁻ region 721 should be fully depleted at 1.2–4.5V. If sufficient electrical connection A between the P⁰ region 722 and the P-epi layer 702 is not achieved, the photodiode may not act as a low-voltage photodiode and not achieve a full depletion.

Figure 7H:
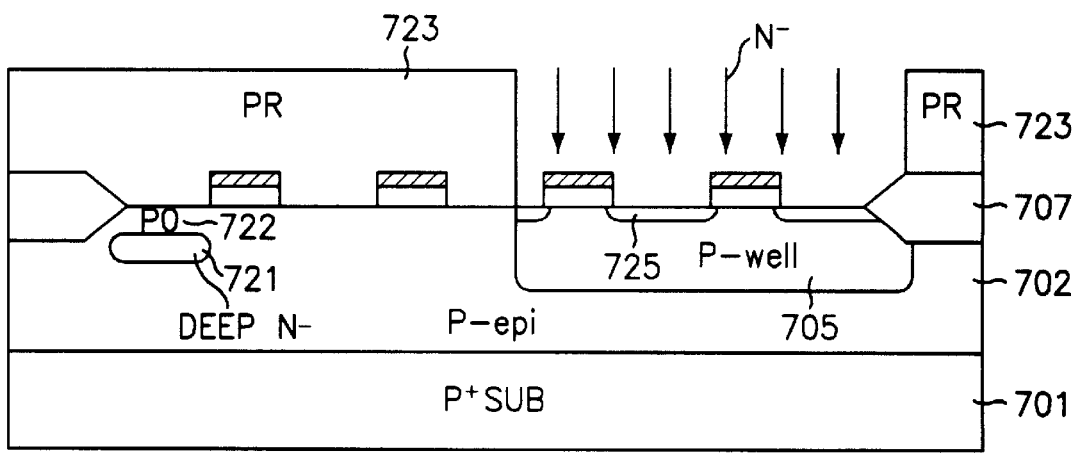

Next, referring to FIG. 7H, after removing the mask pattern 717, a mask pattern 723 is formed on the resulting structure, exposing the P-well region in order to provide the drive and select transistors with the LDD structure. By doing so, the drive and select transistors in the P-well will have the same characteristics as the conventional submicron NMOS transistors. Since this ion implantation for LDD structure is not carried out in the P-epi layer 702, the transfer and reset transistors do not have the LDD structure, i.e., native NMOS transistors.

Figure 7I:
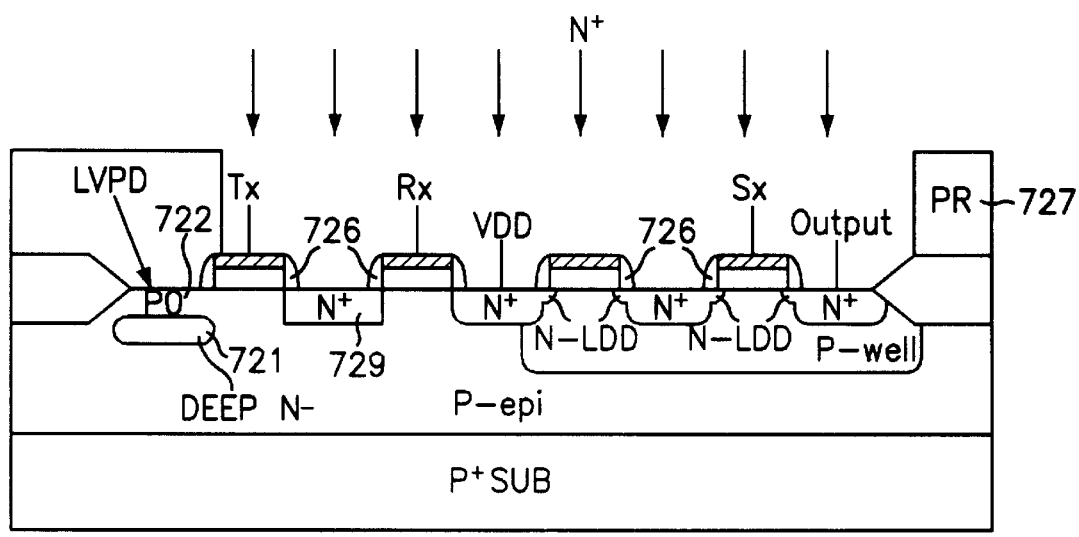

Referring to FIG. 7I, after removing the mask pattern 723, an oxide layer is deposited on the resulting structure by the LPCVD (Low Pressure Chemical Vapor Deposition) method in order to form source/drain regions of the four transistors within the unit pixel. The etchback process is applied to the oxide layer and then oxide spacer layers 726 are formed on the sidewalls of all the transistors. A mask pattern 727 for implanting impurity ions into P-epi layer 702 and the P-well 705, except for the low-voltage photodiode area, is formed on the resulting structure and N⁺ ion implantation is carried out, thereby forming highly doped N⁺ regions 729 for source/drains.

As described above, the native transistors $T_x$ and $R_x$ formed on the P-epi layer 702 have a negative threshold voltage (depletion mode). The characteristics of the native depletion mode transistor are effectively used in the transfer transistor of the present invention. For example, when the charge capacity of the photodiode is reached, excess photoelectric charges will overflow the photodiode and be collected by neighboring pixels. The resulting cross-talk from an intense light source in an image is called "Blooming."

As illustrated in the present invention, in the case where the native transfer transistor in a depletion mode is used, although 0V is applied to the gate of the native transfer transistor, current can flow because of the increased potential difference between the low-voltage photodiode and the floating sensing node, thereby removing the "Blooming."

On the other hand, the self-aligned $N^-$ region 721 and $P^0$ region 722 within the low-voltage photodiode undergo the out-diffusion process through the high-temperature LPCVD process for forming the oxide spacer layers 726. In the case where the $P^0$ region 722 diffuses beyond the $N^-$ region 721 below the transfer transistor gate, a potential barrier, which decreases the charge transfer efficiency, is created at one side of the transfer transistor. Accordingly, in order to avoid creation of this undesired potential barrier at the time of performing the high-temperature LPCVD process, the lateral profile of the $P^0$ and $N^-$ regions 722 and 721 is carefully controlled.

Figure 7J:
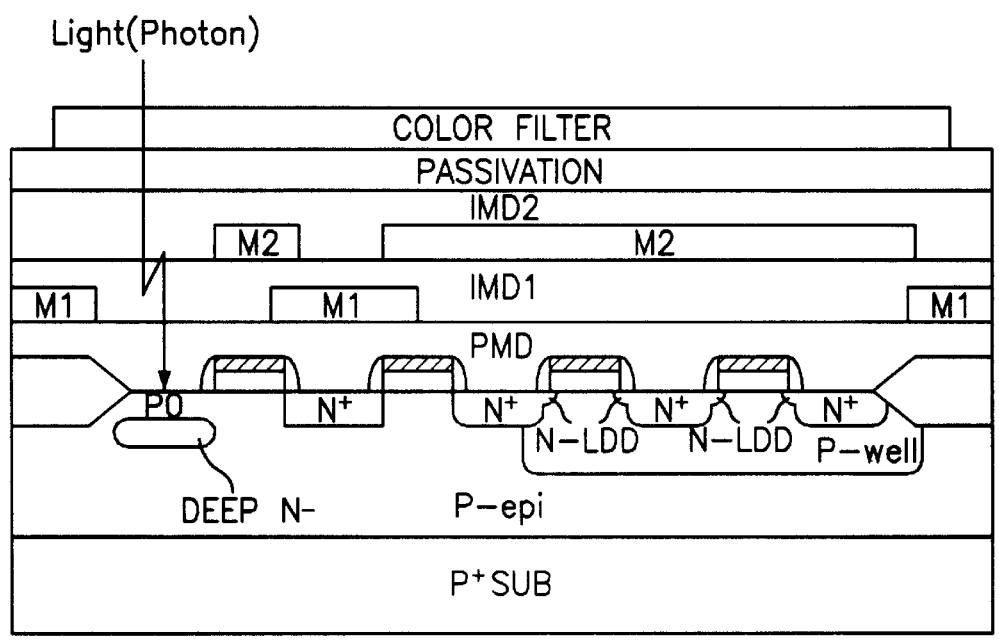

FIG. 7J is a cross-sectional view of the unit pixel after the general back-end processes. As shown in FIG. 7J, after forming highly doped $N^+$ regions 729, interlayer insulating layers PMD, IMD1 and IMD2 and metal layers M1 and M2 are formed and a passivation layer is formed for protecting the device from moisture and scratches. Finally, a color filter array consisting of red, green and blue color arrangement or yellow, magenta and cyan color arrangement is formed on the passivation layer. There are only the insulating layer, passivation layer and color filter on the sensitivity area of the low-voltage photodiode. Also, to shield non-photosensing regions from incident light, another metal layer or opaque light shielding may be used.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A CMOS image sensing device comprising:
   a semiconductor layer of a first conductive type;
   a well region of the first conductive type, being locally positioned at the semiconductor layer;
   a photodiode formed in the semiconductor layer for sensing light from an object;
   at least one depletion transistor formed in the semiconductor layer for transferring photoelectric charges generated in the photodiode to a floating junction which is formed on a portion of the semiconductor layer and which stores the photoelectric charges; and
   at least one enhancement transistor formed in the well region for outputting electrical signals in response to an amount of the photoelectric charges transferred from the floating junction.

2. The CMOS image sensing device in accordance with claim 1, wherein the depletion transistor has a negative threshold voltage and wherein the CMOS image sensing device further comprises a reset transistor formed in the semiconductor layer, and wherein the reset transistor has a negative threshold voltage for resetting a potential at the floating junction.

3. The CMOS image sensing device in accordance with claim 1, wherein the floating junction is a highly doped region of a second conductive type, which is formed in the semiconductor layer and between the depletion transistor and the reset transistor.

4. The CMOS image sensing device in accordance with claim 1, wherein the photodiode comprises:
   a first impurity region of a second conductive type, being formed within the semiconductor layer, wherein the first impurity region is apart from an isolation layer; and
   a second impurity region of the first conductive type, being formed beneath a surface of the semiconductor layer and on the first impurity region, wherein a width of the second impurity region is wider than that of the first impurity region so that a portion of the second impurity region is in contact with the semiconductor layer directly,
   whereby the second impurity region has the same potential as the semiconductor layer.

5. The CMOS image sensing device in accordance with claim 4, wherein the photodiode has a full depletion layer in the semiconductor layer at approximately 1.2–4.5V.

6. The CMOS image sensing device in accordance with claim 4, wherein the photodiode further comprises a semiconductor substrate of the first conductive type, which is formed beneath the semiconductor layer, wherein an impurity concentration of the semiconductor substrate is higher than that of the semiconductor layer.

7. The CMOS image sensing device in accordance with claim 6, wherein a resistivity of the semiconductor layer is in a range of approximately 10–25 ωcm and a resistivity of the semiconductor substrate is about 0.01 ωcm.

8. The CMOS image sensing device in accordance with claim 6, wherein the semiconductor layer is an epitaxial layer grown on the semiconductor substrate.

9. The CMOS image sensing device in accordance with claim 6, wherein a thickness of the semiconductor layer is in a range of approximately 2–5 $\mu$m.

10. The CMOS image sensing device in accordance with claim 9, wherein the epitaxial layer is formed to an impurity concentration of approximately $10^{14}$ ions/cm$^3$.

11. The CMOS image sensing device in accordance with claim 10, wherein the second impurity region is formed to an impurity concentration of approximately $10^{18}$ ions/cm$^3$.

12. The CMOS image sensing device in accordance with claim 11, wherein the first impurity region is formed to an impurity concentration of approximately $10^{17}$ ions/cm$^3$.

13. The CMOS image sensing device in accordance with claim 4, wherein the first conductive type is a P-type and the second conductive type is an N-type.

14. A CMOS image sensing device comprising:
   a semiconductor layer of a first conductive type;
   a well region of the first conductive type, being locally positioned at the semiconductor layer;
   at least one photodiode formed in the semiconductor layer and outside of the well region for sensing light from an object;
   a floating junction for storing photoelectric charges generated in the photodiode;
   a first depletion transistor formed outside of the well region and between the photodiode and the floating junction for transferring the photoelectric charges to the floating junction, and wherein the first depletion transistor is controlled in response to a first control signal;

a second depletion transistor formed outside of the well region and coupled to the floating junction for resetting the floating junction to a predetermined potential;

a first enhancement transistor formed in the well region and for outputting electrical signals in response to an amount of the photoelectric charges stored in the floating junction, wherein a common active region of the second depletion transistor and the first enhancement transistor is positioned at a boundary between the semiconductor layer and the well region; and a second enhancement transistor formed in the well region and receiving address signals for selecting a pixel.

15. The CMOS image sensing device in accordance with claim 14, wherein the first and second enhancement transistors have a lightly doped drain (LDD) structure.

16. The CMOS image sensing device in accordance with claim 14, wherein the photodiode comprises:

a first impurity region of a second conductive type, being formed within the semiconductor layer, wherein the first impurity region is apart from an isolation layer; and a second impurity region of the first conductive type, being formed beneath a surface of the semiconductor layer and on the first impurity region, wherein a width of the second impurity region is wider than that of the first impurity region so that a portion of the second impurity region is in contact with the semiconductor layer directly, whereby the second impurity region has the same potential as the semiconductor layer.

17. The CMOS image sensing device in accordance with claim 16, wherein the photodiode has a full depletion layer in the semiconductor layer at approximately 1.2–4.5V.

18. The CMOS image sensing device in accordance with claim 16, wherein the semiconductor layer is an epitaxial layer formed on a semiconductor substrate of the first conductive type.

19. The CMOS image sensing device in accordance with claim 16, wherein the first or second depletion transistor has a gate electrode including a polysilicon layer and a silicide layer.

20. The CMOS image sensing device in accordance with claim 16, wherein the first or second depletion transistor has a spacer insulating layer formed on a gate electrode thereof.

* * * * *